(12) United States Patent
Hsu

(10) Patent No.: US 7,767,636 B2
(45) Date of Patent: Aug. 3, 2010

(54) NANOELECTRONIC AND MICROELECTRONIC CLEANING COMPOSITIONS

(75) Inventor: Chien-Pin Sherman Hsu, Basking Ridge, NJ (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 608 days.

(21) Appl. No.: 10/584,827

(22) PCT Filed: Feb. 11, 2005

(86) PCT No.: PCT/US2005/004350

§ 371 (c)(1),
(2), (4) Date: Jun. 27, 2006

(87) PCT Pub. No.: WO2005/093032

PCT Pub. Date: Oct. 6, 2005

(65) Prior Publication Data

US 2009/0163396 A1 Jun. 25, 2009

(51) Int. Cl.
*C11D 7/50* (2006.01)
(52) U.S. Cl. .................. 510/175; 134/1.3
(58) Field of Classification Search .......... 510/175; 134/1.3
See application file for complete search history.

(56) References Cited

U.S. PATENT DOCUMENTS

| | | | |
|---|---|---|---|
| 5,883,060 A | 3/1999 | Lim et al. | |
| 6,764,552 B1 * | 7/2004 | Joyce et al. | 134/3 |
| 6,905,556 B1 * | 6/2005 | Humayun et al. | 134/36 |
| 6,958,123 B2 * | 10/2005 | Reid et al. | 216/2 |
| 7,011,716 B2 * | 3/2006 | Xu et al. | 134/34 |
| 7,419,945 B2 * | 9/2008 | Hsu | 510/175 |
| 7,485,611 B2 * | 2/2009 | Roeder et al. | 510/175 |
| 2004/0011386 A1 | 1/2004 | Seghal | |
| 2004/0142564 A1 * | 7/2004 | Mullee et al. | 438/689 |
| 2004/0171502 A1 * | 9/2004 | Clark et al. | 510/175 |
| 2004/0216772 A1 * | 11/2004 | Xu et al. | 134/36 |
| 2004/0224865 A1 * | 11/2004 | Roeder et al. | 510/175 |
| 2007/0149429 A9 * | 6/2007 | Roeder et al. | 510/175 |

FOREIGN PATENT DOCUMENTS

| | | |
|---|---|---|
| WO | WO 03/104900 | 5/2003 |
| WO | WO 2004/102621 | 5/2004 |

* cited by examiner

*Primary Examiner*—Gregory E Webb
(74) *Attorney, Agent, or Firm*—George W. Rauchfuss, Jr., Esq.; Ohlandt, Greeley, Ruggiero & Perle

(57) ABSTRACT

Nanoelectronic and microelectronic cleaning corn positions for cleaning nanoelectronic and microelectronic substrates under supercritical fluid state conditions, and particularly cleaning compositions useful with and having improved compatibility with nanoelectronic and microelectronic substrates characterized by silicon dioxide, sensitive low-n or high-K dielectrics and copper, tungsten, tantalum, nickel, gold, cobalt, palladium, platinum, chromium, ruthenium, rhodium, iridium, hafnium, titanium, molybdenum, tin and other metallization, as well as substrates of A1 or Al(Cu) metallizations and advanced interconnect technologies, are provided by nanoelectronic and microelectronic cleaning compositions.

14 Claims, No Drawings

NANOELECTRONIC AND MICROELECTRONIC CLEANING COMPOSITIONS

FIELD OF THE INVENTION

This invention relates to methods and cleaning compositions for cleaning nanoelectronic and microelectronic substrates with supercritical fluid compositions, and particularly to such cleaning compositions useful with and having improved compatibility with nanoelectronic and microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations and advanced interconnect technologies, and particularly such substrates having high aspect ratio openings, including difficult submicron crevices, grooves, trenches and vias. The invention also relates to the use of such cleaning compositions for stripping photoresists, and cleaning residues from plasma process generated organic, organometallic and inorganic compounds, and cleaning residues from planarization processes such as chemical mechanical polishing (CMP) and as additives in planarization slurry/liquids.

BACKGROUND TO THE INVENTION

Many photoresist strippers and residue removers have been proposed for use in the microelectronics field as downstream or back end of the manufacturing line cleaners. In the manufacturing process a thin film of photoresist is deposited on a wafer substrate, and then circuit design is imaged on the thin film. Following baking, the exposed portion of the positive resist or the unexposed portion of the negative resist is removed with a photoresist developer. The resulting image is then transferred to the underlying material, which is generally a dielectric or metal, by way of reactive plasma etch gases or chemical etchant solutions. The etchant gases or chemical etchant solutions selectively attack the photoresist-unprotected area of the substrate. As a result of the plasma etching process, photoresist, etching gas and etched material by-products are deposited as residues around or on the sidewall of the etched openings on the substrate.

Additionally, following termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned nanoelectronic and microelectronic device dimensions have decreased for the production of current and future generation nanoelectronic and microelectronic semiconductor devices and other items such as flat panel displays, it has become increasingly common in the art to employ copper metallizations, low-κ (both porous and non-porous) and high-κ dielectrics. These materials have presented additional challenges to find acceptable cleaner compositions. Many process technology compositions that have been previously developed for "traditional" or "conventional" semiconductor devices containing Al/SiO$_2$, Al(Cu)/SiO$_2$, or Al/Mo/SiO$_2$ structures cannot be employed with copper, tungsten, tantalum, nickel, gold, cobalt, palladium, platinum, chromium, ruthenium, rhodium, iridium, hafnium, titanium, molybdenum, tin and other metallized, and low-κ or high-κ dielectric structures. For example, hydroxylamine based stripper or residue remover compositions are successfully used for cleaning devices with Al metallizations, but are practically unsuitable for those with copper and other metallizations. Similarly, many copper metallized/low-κ strippers are not suitable for Al metallized devices unless significant adjustments in the compositions are made.

Removal of these etch and/or ash residues following the plasma etch and/or ashing process has proved problematic. Failure to completely remove or neutralize these residues can result in the absorption of moisture and the formation of undesirable materials that can cause corrosion to the metal structures or electrical defects to the integrated circuitry. The circuitry materials are corroded by the undesirable materials and produce discontinuances in the circuitry wiring and undesirable increases in electrical resistance. This problem is also especially evident in removing sidewall deposited photoresist or residues and surface-hardened photoresist hardened due to UV radiation, reactive ion etching or ion implantation processes. There is also a problem of removing photoresist and is other residues when they are present in structures having high aspect ratio openings, including difficult submicron grooves and narrow crevices.

The current back end cleaners show a wide range of compatibility with certain, sensitive dielectrics and metallizations, ranging from totally unacceptable to marginally satisfactory. Many of the current strippers or residue cleaners are not acceptable for advanced interconnect materials such as porous and low-κ dielectrics and copper metallizations. Additionally, the typical alkaline cleaning solutions employed are overly aggressive towards porous and low-κ and high-κ dielectrics and/or copper metallizations. Moreover, many of these alkaline cleaning compositions contain organic solvents that show poor product stability, especially at higher pH ranges and at higher process temperatures.

In an attempt to at least partially address these problems, it has been proposed to employ supercritical fluids to remove such organic and inorganic residues from such substrates. Examples of such proposals are found in the disclosure in U.S. Pat. Nos. 6,242,165B1, 6,306,564B1, 6,500,605B1 and 6,653,236B2. In these patents it is proposed to clean substrates with supercritical fluids such as carbon dioxide, ammonia, nitrous oxide, carbon monoxide, and inert gases such as nitrogen, helium, neon, argon, krypton and xenon, and particularly carbon dioxide. It is proposed to employ supercritical fluids alone or with various simple modifiers, such as oxidizers (U.S. Pat. No. 6,242,265B1), carbon dioxide with chemical solvents (U.S. Pat. No. 6,306,564B1), and carbon dioxide, an amine and a solvent (U.S. Pat. No. 6,500,605B1). However, the cleaning efficiencies and capabilities of the supercritical fluids alone or with the simple modifiers have been limited in removing bulk photoresist and difficult-to-remove plasma generated residues.

BRIEF SUMMARY OF THE INVENTION

There is, therefore, a need for reasonably stable, homogeneous supercritical state nanoelectronic and microelectronic cleaning compositions that are suitable for semiconductor and flat panel display cleaning operations with supercritical fluids, which compositions are effective cleaners and are applicable for stripping photoresists and cleaning residues from plasma process generated organic, organometallic and inorganic compounds, cleaning residues from planarization processes, such as CMP, and which can be used for advanced interconnect materials employing copper and other metallizations, including but not limited to tungsten, tantalum, nickel, gold, cobalt, palladium, platinum, chromium, ruthenium, rhodium, iridium, hafnium, titanium, molybdenum, and tin metallization, and porous or non-porous low-κ (i.e., a κ value of 3 or less) or high-κ (i.e., a κ value of 20 or greater) dielectrics as well as useful for cleaning conventional devices, such as those with aluminum or aluminum(copper) metallizations containing silicon dioxide, low-κ or high-κ dielectrics.

It has been discovered that effective nanoelectronic and microelectronic supercritical fluid cleaning compositions for cleaning microelectronic substrates under supercritical fluid conditions, and particularly cleaning compositions useful with and having improved compatibility with microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations and advanced interconnect technologies, are provided by such reasonably stable, homogeneous supercritical state nanoelectronic and microelectronic cleaning compositions that are generally effective cleaners for cleaning such devices. Such reasonably stable, homogeneous supercritical state nanoelectronic and microelectronic cleaning compositions of this invention are provided by compositions comprising: (1) a supercritical main fluid reaching a supercritical fluid state at a temperature of 250° C. or less and a pressure of 600 bars or less (592.2 atm, 8702.3 psi), and (2) as a secondary fluid, a modifier formulation selected from the following formulations:

a) a formulation comprising: an oxidizing agent; a polar organic solvent selected from the group consisting of amides, sulfones, sulfolenes, selenones and saturated alcohols; and optionally other components;

b) a silicate free formulation comprising: a polar organic solvent selected from the group consisting of amides, sulfones, selenones and saturated alcohols; a strong alkaline base; and optionally other components;

c) a formulation comprising: from about 0.05% to 30% by weight of one or more non-ammonium producing strong base containing non-nucleophilic, positively charged counter ions; from about 0.5 to about 99.95% by weight of one or more corrosion inhibiting solvent compounds, said corrosion inhibiting solvent compound having at least two sites capable of complexing with metals; and optionally other components;

d) a formulation comprising: from about 0.05 to 20% by weight of one or more non-ammonium producing, non-HF producing fluoride salt; from about 5 to about 99.95% by weight of water, organic solvent or both water and organic solvent; and optionally other components; and e) a formulation comprising: from about 0.05% to 30% by weight of one or more non-ammonium producing strong base containing non-nucleophilic, positively charged counter ions; from about 5 to about 99.95% by weight of one or more steric hindered amide solvents; and optionally other components. More preferably such reasonably stable, homogeneous supercritical state nanoelectronic and microelectronic cleaning compositions of this invention for use under supercritical fluid conditions are provided by compositions comprising: (1) a supercritical main fluid reaching a supercritical fluid state at a temperature of 250° C. or less, preferably at a temperature of 150° C. or less, and a pressure of 600 bars (592.2 atm, 8702.3 psi), preferably a pressure of 400 bars (394.8 atm, 5801.5 psi) or less, more preferably a pressure of 300 bars (296.1 atm, 4351.1 psi) or less, and (2) as a secondary fluid, a modifier formulation selected from the following formulations:

a) a formulation comprising:
  an oxidizing agent;
  polar organic solvent selected from the group consisting of amides, sulfones, sulfolenes, selenones and saturated alcohols;
  and optionally one or more of the following components:
  an acid;
  an alkaline base;
  a corrosion-inhibiting co-solvent;
  a chelating or metal complexing agent;
  an oxidizer stabilizing agent;
  a corrosion-inhibiting agent;
  a metal corrosion inhibitor;
  a fluoride compound;
  a surfactant; and
  water;

b) a silicate free formulation comprising:
  polar organic solvent selected from the group consisting of amides, sulfones, selenones and saturated alcohols; and
  a strong alkaline base;

and optionally one or more of the following components:
  an acid;
  a corrosion-inhibiting co-solvent;
  a chelating or metal complexing agent;
  an oxidizer stabilizing agent;
  a corrosion-inhibiting agent;
  a metal corrosion inhibitor;
  a fluoride compound;
  a surfactant; and
  water;

c) a formulation comprising:
  from about 0.05% to 30% by weight of one or more non-ammonium producing strong base containing non-nucleophilic, positively charged counter ions;
  from about 0.5 to about 99.95% by weight of one or more corrosion inhibiting solvent compounds, said corrosion inhibiting solvent compound having at least two sites capable of complexing with metals;
  from about 0 to about 99.45% by weight water or other organic co-solvent;
  from about 0 to 40% by weight a steric hindered amine or alkanolamine;
  from about 0 to 40% by weight an organic or inorganic acid;
  from about 0 to 40% by weight of an other metal corrosion inhibitor compounds;
  from about 0 to 5% by weight a surfactant;
  from about 0 to 10% by weight of a metal ion free silicate compound;
  from about 0 to 5% by weight of a metal chelating agent; and
  from about 0 to 10% by weight of a fluoride compound;

d) a formulation comprising:
  from about 0.05 to 20% by weight of one or more non-ammonium producing, non-HF producing fluoride salt;
  from about 5 to about 99.95% by weight of water, organic solvent or both water and organic solvent;
  from about 0 to about 80% by weight of a metal corrosion inhibiting solvent;
  from about 0 to 40% by weight a steric hindered amine or alkanolamine;

from about 0 to 40% by weight of an organic or inorganic acid;

from about 0 to 40% by weight of an other metal corrosion inhibitor compound;

from about 0 to 5% by weight of a surfactant;

from about 0 to 10% by weight of a metal ion free silicate compound; and from about 0 to 5% by weight of a metal chelating agent; and e) a formulation comprising:

from about 0.05% to 30% by weight of one or more non-ammonium producing strong base containing non-nucleophilic, positively charged counter ions;

from about 5 to about 99.95% by weight of one or more steric hindered amide solvents;

from about 0 to about 95% by weight water or other organic co-solvent;

from about 0 to 40% by weight a steric hindered amine or alkanolamine;

from about 0 to 40% by weight an organic or inorganic acid;

from about 0 to 40% by weight of an other metal corrosion inhibitor compounds;

from about 0 to 5% by weight a surfactant;

from about 0 to 10% by weight of a metal ion free silicate compound;

from about 0 to 5% by weight of a metal chelating agent; and from about 0 to 10% by weight of a fluoride compound.

The invention also comprises the use of such nanoelectronic and microelectronic cleaning compositions to clean nanoelectronic and microelectronic substrates.

These reasonably stable, homogeneous supercritical state nanoelectronic and microelectronic cleaning compositions of this invention provide improved and superior cleaning and stripping photoresist and provide for organic and inorganic residue removal with surprisingly good compatibilities with many sensitive substrates, under elevated temperatures and pressures that are required for many common supercritical fluid operations. Such reasonably stable, homogeneous supercritical state nanoelectronic and microelectronic cleaning compositions of this invention provide particular advantageous capabilities for nanoelectronic and microelectronic cleaning applications, residue removal, cleaning residues from planarization processes, such as chemical mechanical polishing, and for use as additives in planarization slurry/liquids.

The nanoelectonic and microelectronic cleaning compositions of this invention are suitable for stripping photoresists and cleaning residues from plasma process generated organic, organometallic and inorganic compounds, and have improved compatibility with microelectronic substrates characterized by silicon dioxide, sensitive low-κ or high-κ dielectrics and copper, tungsten, tantalum, nickel, gold, cobalt, palladium, platinum, chromium, ruthenium, rhodium, iridium, hafnium, titanium, molybdenum, tin and other metallization, as well as substrates of Al or Al(Cu) metallizations, and advanced interconnect technologies. Additionally, the cleaning compositions of this invention are particularly suitable for cleaning difficult samples containing very stubborn plasma etch and ash residues and also hardened (e.g., polymerized) photoresists that are generated in the manufacturing process for producing Cu/low-κ and high-κ dielectrics structures. The cleaning compositions of this invention may be used alone or coupled with other cleaning solutions.

DETAILED DESCRIPTION OF THE INVENTION AND PREFERRED EMBODIMENTS

The reasonably stable, homogeneous supercritical state nanoelectronic and microelectronic cleaning compositions of this invention are provided by compositions comprising: (1) a supercritical main fluid reaching a supercritical fluid state at a temperature of 250° C. or less and a pressure of 600 bars or less (592.2 atm, 8702.3 psi), and (2) as a secondary fluid, a modifier formulation selected from the following formulations:

a) a formulation comprising: an oxidizing agent; a polar organic solvent selected from the group consisting of amides, sulfones, sulfolenes, selenones and saturated alcohols; and optionally other components;

b) a silicate free formulation comprising: a polar organic solvent selected from the group consisting of amides, sulfones, selenones and saturated alcohols; a strong alkaline base; and optionally other components;

c) a formulation comprising: from about 0.05% to 30% by weight of one or more non-ammonium producing strong base containing non-nucleophilic, positively charged counter ions; from about 0.5 to about 99.95% by weight of one or more corrosion inhibiting solvent compounds, said corrosion inhibiting solvent compound having at least two sites capable of complexing with metals; and optionally other components;

d) a formulation comprising: from about 0.05 to 20% by weight of one or more non-ammonium producing, non-HF producing fluoride salt; from about 5 to about 99.95% by weight of water, organic solvent or both water and organic solvent; and optionally other components; and e) a formulation comprising: from about 0.05% to 30% by weight of one or more non-ammonium producing strong base containing non-nucleophilic, positively charged counter ions; from about 5 to about 99.95% by weight of one or more steric hindered amide solvents; and optionally other components. More preferably such reasonably stable, homogeneous supercritical state nanoelectronic and microelectronic cleaning compositions of this invention are provided by compositions comprising: (1) a supercritical main fluid reaching a supercritical fluid state at a temperature of 250° C. or less, preferably at a temperature of 150° C. or less, and a pressure of 600 bars (592.2 atm, 8702.3 psi), preferably a pressure of 400 bars (394.8 atm, 5801.5 psi) or less, more preferably a pressure of 300 bars (296.1 atm, 4351.1 psi) or less, and (2) as a secondary fluid a modifier formulation selected from the following formulations:

a) a formulation comprising:
an oxidizing agent;
polar organic solvent selected from the group consisting of amides, sulfones, sulfolenes, selenones and saturated alcohols;
and optionally one or more of the following components:
an acid;
an alkaline base;
a corrosion-inhibiting co-solvent;
a chelating or metal complexing agent;
an oxidizer stabilizing agent;
a corrosion-inhibiting agent;
a metal corrosion inhibitor;
a fluoride compound;
a surfactant; and
water;

b) a silicate free formulation comprising:
  polar organic solvent selected from the group consisting of amides, sulfones, selenones and saturated alcohols; and
  a strong alkaline base;

and optionally one or more of the following components:
  an acid;
  a corrosion-inhibiting co-solvent;
  a chelating or metal complexing agent;
  an oxidizer stabilizing agent;
  a corrosion-inhibiting agent;
  a metal corrosion inhibitor;
  a fluoride compound;
  a surfactant; and
  water;
c) a formulation comprising:
  from about 0.05% to 30% by weight of one or more non-ammonium producing strong base containing non-nucleophilic, positively charged counter ions;
  from about 0.5 to about 99.95% by weight of one or more corrosion inhibiting solvent compounds, said corrosion inhibiting solvent compound having at least two sites capable of complexing with metals;
  from about 0 to about 99.45% by weight water or other organic co-solvent;
  from about 0 to 40% by weight a steric hindered amine or alkanolamine;
  from about 0 to 40% by weight an organic or inorganic acid;
  from about 0 to 40% by weight of an other metal corrosion inhibitor compounds;
  from about 0 to 5% by weight a surfactant;
  from about 0 to 10% by weight of a metal ion free silicate compound;
  from about 0 to 5% by weight of a metal chelating agent; and
  from about 0 to 10% by weight of a fluoride compound;
d) a formulation comprising:
  from about 0.05 to 20% by weight of one or more non-ammonium producing, non-HF producing fluoride salt;
  from about 5 to about 99.95% by weight of water, organic solvent or both water and organic solvent;
  from about 0 to about 80% by weight of a metal corrosion inhibiting solvent;
  from about 0 to 40% by weight a steric hindered amine or alkanolamine;
  from about 0 to 40% by weight of an organic or inorganic acid;
  from about 0 to 40% by weight of an other metal corrosion inhibitor compound;
  from about 0 to 5% by weight of a surfactant;
  from about 0 to 10% by weight of a metal ion free silicate compound; and
  from about 0 to 5% by weight of a metal chelating agent; and
e) a formulation comprising:
  from about 0.05% to 30% by weight of one or more non-ammonium producing strong base containing non-nucleophilic, positively charged counter ions;
  from about 5 to about 99.95% by weight of one or more steric hindered amide solvents;
  from about 0 to about 95% by weight water or other organic co-solvent;
  from about 0 to 40% by weight a steric hindered amine or alkanolamine;
  from about 0 to 40% by weight an organic or inorganic acid;
  from about 0 to 40% by weight of an other metal corrosion inhibitor compounds;
  from about 0 to 5% by weight a surfactant;
  from about 0 to 10% by weight of a metal ion free silicate compound;
  from about 0 to 5% by weight of a metal chelating agent; and
  from about 0 to 10% by weight of a fluoride compound.

The reasonably stable, homogeneous supercritical state nanoelectronic and microelectronic cleaning compositions of this invention will generally comprise from about 0.1% to about 50%, preferably from about 3%, to about 25%, and more preferably from about 5% to about 20%, by weight of the secondary fluid modifier formulation component (2) based on the weight of the supercritical main fluid component (1).

The supercritical main fluid component (1) is one reaching a supercritical fluid state at a temperature of 250° C. or less, preferably at a temperature of 150° C. or less, and a pressure of 600 bars (592.2 atm, 8702.3 psi), preferably a pressure of 400 bars (394.8 atm, 5801.5 psi) or less, more preferably a pressure of 300 bars (296.1 atm, 4351.1 psi) or less. Any suitable material meeting this supercritical-fluid-criteria may be employed in the nanoelectronic and microelectronic cleaning compositions of this invention. Such materials include, but are not limited to, carbon dioxide, ammonia, argon, butane, carbon disulfide, chlorotrifluoromethane, 2,2'-dimethylpropane, ethane, fluoromethane, hexane, heptane, hydrogen sulfide, methanol, nitrogen, nitrogen oxide, pentane, propane, sulfur dioxide, water, trifluoromethane, 2-propanol, dichloromethane, sulfur hexafluoride, nitrous oxide, carbon monoxide, and inert gases such as nitrogen, helium, neon, argon, krypton and xenon. Carbon dioxide is generally preferred since it forms supercritical fluid readily with critical temperature of 31° C. and critical pressure of 73.77 bar (72.8 atm, 1,070 psi).

In formulation a) of component (2) of the cleaning compositions of this invention, the oxidizing agent of formulation a) may be any oxidizing agent suitable for use in nanoelectronic and microelectronic cleaning compositions. As examples of such oxidizing agents there may be mentioned, for example, peroxides, particularly hydrogen peroxide, molecular adducts of peroxyhydrates from hydrogen peroxides and oxyacids, zirconyl acetate and azo compounds, e.g., sodium percarbonate, sodium perborates, as well as periodates ($IO_4^-$), perborates, permanganates ($MnO_4^-$), hydrogen persulfates, persulfates and alkyloxyhalides, for example t-BuOCl. Other peroxy compounds from substitution reactions of $H_2O_2$ and organic molecules may be employed but are less preferred. Examples include alkylperoxides, peroxyacids, diacyl peroxides and ketone peroxides. Similar substitution products of $H_2O_2$ with inorganic molecules, such as peroxysulfuric acid, may also be employed. The oxidizing agent is employed in the formulation a) in an amount of from about 0.1 to about 30 wt %, preferably from about 0.1 to about 5 wt %, and most preferably in an amount of from about 1 to about 5 wt % of formulation a). The preferred oxidizing agent is hydrogen peroxide ($H_2O_2$), preferably employed as a 3 to 30% aqueous solution.

In formulation a) of component (2), the organic solvent is a polar organic solvent with hydrogen bonding capability and which is minimally or non-reactive with the oxidizing agent. Such organic solvents include amides, sulfones, sulfolenes, selenones, and saturated alcohols. Among the preferred solvents there may be mentioned sulfolane (tetrahydrothiopene-1,1-dioxide), 3-methylsulfolane, n-propyl sulfone, n-butyl sulfone, sulfolene (2,5-dihydrothiopene-1,1-dioxide), 3-methylsulfolene, amides such as 1-(2-hydroxyethyl)-2-pyrrolidinone (HEP), dimethylpiperidone (DMPD), N-methylpyrrolidinone (NMP), and dimethylacetamide (DMAc), dimethylformamide (DMF), and saturated alcohols such as ethanol, propanol, butanol, hexanol, ethylene glycol, propylene glycol, glycerol, and hexafluoroisopropanol. The organic solvent component can include one or more of the solvents and is generally present in the formulation a) in an amount of from about 1 to about 99.9 wt %, preferably in an amount of from about 10 to about 90 wt %, and most preferably in an amount of from about 30 to 80 wt % of formulation a). These solvents are resistant to acidic and alkaline conditions and will not bind the oxidizing agent too tightly. Additionally, they are capable of stabilizing the oxidizing agent, such as hydrogen peroxide, by forming stable complexes through interaction such as hydrogen bonding.

Water can be present in the formulation a) of component (2) of the cleaning compositions of this invention and when present can be present in an amount of from about 0.1 to about 98 wt %, preferably in an amount of from about 10 to about 60 wt %, most preferably in an amount of from about 15 to about 50 wt % of the formulation a). The water can be present as part of the aqueous portion of the other components and/or as additional added water.

The alkaline base is present as an optional, but generally preferred component of the formulation a) of component (2) of the cleaning compositions of this invention. The alkaline base can be present in the formulation in an amount of from 0 to about 30 wt %, preferably in an amount of from about 0.1 to about 10 wt %, most preferably in an amount of from about 0.1 to about 5 wt % of formulation a). Any suitable alkaline base may be employed in formulation a) of the cleaning compositions. The base is preferably ammonia hydroxide or an ammonia or non-ammonia derived base. When the cleaning composition of this invention is intended to be used to clean copper metallized structures the base is preferably a non-ammonia derived base and when the cleaning composition of this invention is intended to be used to clean aluminum containing structures the alkaline base is preferably ammonium hydroxide, a ammonia derived base, or a non-ammonia derived base in combination with a corrosion-inhibiting co-solvent and/or corrosion-inhibiting agent, as disclosed hereinafter. As examples of suitable non-ammonia derived bases there may be mentioned tetraalkylammonium hydroxides such as those of the formula $R_4N^+OH^-$ where each R is independently a substituted or unsubstituted alkyl groups, preferably of 1 to 22 carbon atoms and more preferably 1 to 4 carbon atoms. Among the non-ammonia derived alkaline bases useful in the formulation a) component there may be mentioned, for example, tetramethylammonium hydroxide, tertrabutylammonium hydroxide, choline hydroxide, and the like. Inorganic bases such as for example potassium hydroxide, sodium hydroxide and the like may also be used as the alkaline base.

An indicated before, the formulation a) of component (2) of the cleaning composition of this invention can also be employed under acid pH conditions and any suitable acid component can be employed in the necessary amount sufficient to provide the acidic pH to the composition, such as for example HCl or HF.

The formulation a) of component (2) of the cleaning composition may also optionally include one or more corrosion-inhibiting co-solvents. Preferred corrosion-inhibiting co-solvents useful in the formulation a) of this invention are those of the general formula

where $R_1$ and $R_2$ are each independently selected from H, alkyl, preferably alkyl of from 1 to 6 carbon atoms, aryl, preferably aryl of from 3 to 14 carbon atoms, $OR_3$ and $SO_2R_4$; n is a numeral of from 2 to 6, preferably 2 or 3; W and Y are each independently selected from $OR_3$, and $SO_2R_4$; and $R_3$ and $R_4$ are each independently selected from H, alkyl, preferably alkyl of from 1 to 6 carbon atoms, and aryl, preferably aryl of from 3 to 14 carbon atoms. As examples of such corrosion-inhibiting co-solvents there may be mentioned, for example, ethylene glycol, propylene glycol and glycerol and the like. If the required polar organic solvent component of the formulation a) is not a saturated alcohol within the above-mentioned formula, such a saturated alcohol may be present as a co-solvent. The co-solvents may be present in the formulation a) in an amount of from 0 to about 80 wt %, preferably from about 1 to about 50 wt %, most preferably from about 1 to 30 wt % of formulation a).

Formulation a) of component (2) of the cleaning compositions of this invention may also contain other corrosion-inhibiting agents, preferably aryl compounds containing two or more OH, $OR_6$, and/or $SO_2R_6R_7$ groups bonded directly to the aromatic ring, where $R_6$, $R_7$ and $R_8$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in formulation a) in an amount of from 0 to about 15 wt %, preferably from about 0.1 to about 10 wt %, most preferably from about 0.5 to about 5 wt % of formulation a).

Organic or inorganic chelating or metal complexing agents are not required in formulation a) of component (2), but offer substantial benefits, such as for example, improved product stability. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e.g. ethylenediamine tetra(methylene phosphonic acid) (EDTMP), diethylenetriamine penta(methylene phosphonic acid), triethylenetetramine hexa(methylene phosphonic acid). The chelating agent will be present in the composition in an amount of from 0 to about 5 wt %, preferably from about 0.1 to about 2 wt % of formulation a). Metal chelating or complexing agents of various phosphonates, such as ethylenediamine tetra(methylene phosphonic acid) (EDTMP) offer much improved stabilization of the cleaning compositions of the cleaning compositions of this invention containing oxidizing agents at acidic and alkaline conditions and thus are generally preferred.

Other stabilizers for oxidizing agents can also be employed in formulation a) of component (2) of the cleaning compositions of this invention if desired. These stabilizers may be employed in an amount ranging from 0 to about 10 wt %, preferably from about 0.1 to 5 wt % of formulation a). Examples of such stabilizer include but are not limited to acetanilide and silicates, preferably metal ion-free silicates such as tetraalkylammonium silicates (including hydroxy- and alkoxy alkyl groups) where the alkyl group, preferably contains from 1 to 4 carbon atoms. Among such silicates are tetraethylorthosilicate, tetramethylammonium silicate, tetrakis(2-hydroxyethyl) orthosilicate and the like.

Other metal corrosion inhibitors, such as benzotriazole, may be employed in formulation a0 of component (2) in an amount of from 0 to about 5 wt %, preferably from about 0.1 to 2 wt % of formulation a).

Formulation a) of component (2) of the cleaning compositions of this invention optionally may also contain surfactants, such as for example dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in formulation a) in an amount of from 0 to about 5 wt %, preferably 0.1 to about 3 wt % of formulation a).

Formulation a) of component (2) of the cleaning compositions of this invention may also optionally contain fluoride compounds in cleaning composition, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in formulation a) in an amount of from 0 to 10 wt %, preferably from about 0.1 to 5 wt % of formulation a).

Examples of formulation a) of component (2) of the cleaning compositions of this invention are set forth in the following formulations in Tables 1 to 9, in which the amount of the components are indicated in parts by weight of the formulation.

In the following Tables the abbreviations employed are as follows.
- HEP=1-(2-hydroxyethyl)-2-pyrrolidinone
- TMAH=tetramethylammonium hydroxide
- TMAF=tetramethylammonium fluoride
- ACA=acetanilide
- CyDTA=trans- 1,2-cyclohexanediamine tetraacetic acid
- TEOS=tetraethylorthosilicate
- DMPD=dimethylpiperidone
- SFL=sulfolane
- TMAS=tetramethylammonium silicate
- EG=ethylene glycol
- CAT=catechol
- EHDP=ethane-1-hydroxy-1,1-diphosphonate
- EDTMP=ethylenediamine tetra(methylene phosphonic acid)
- 1N HCl=1 normal hydrochloric acid
- $NH_4OH$=ammonium hydroxide
- CH=choline hydroxide
- Water=additional water over water from aqueous solution of components.

Also in the following Tables the formulations XM-188, XM-188A and XM-191 refer to the following compositions in which the listed components are present in the parts by weight indicated in the parenthesis.
- XM-188=SFL (300), Water (75), 25% TMAH (25), CyDTA (2.3)
- XM-188A=SFL (150), Water (60), 25% TMAH (17.5), EDTMP (1.8)
- XM-191=SFL (150), Water (60), 25% TMAH (17.5), EDTMP (1.8), EG (30)

TABLE 1

| Component | A | B | C | D | E | F | G |
|---|---|---|---|---|---|---|---|
| HEP | 30 | 30 | 30 | 30 |  | 60 |  |
| 25% TMAH | 2 | 2.6 | 2 | 2 | 2 | 5 | 5 |

TABLE 1-continued

| Component | A | B | C | D | E | F | G |
|---|---|---|---|---|---|---|---|
| ACA | 0.2 | 0.2 |  |  |  |  |  |
| CyDTA |  | 0.2 |  |  |  | 0.4 | 0.4 |
| TEOS |  |  | 1 |  |  |  |  |
| DMPD |  |  |  |  | 30 |  | 60 |
| SFL |  |  |  |  |  |  |  |
| EG |  |  |  |  |  |  |  |
| CAT |  |  |  |  |  |  |  |
| 60% EHDP |  |  |  |  |  |  |  |
| EDTMP |  |  |  |  |  |  |  |
| TMAF |  |  |  |  |  |  |  |
| 10% TMAS |  |  |  |  |  |  |  |
| 29% $NH_4OH$ |  |  |  |  |  |  |  |
| 30% $H_2O_2$ | 2.5 | 2.5 | 2.5 | 2.5 | 2.5 | 5 | 5 |
| Water | 15 | 15 | 15 | 15 | 15 | 30 | 30 |
| XM-188 |  |  |  |  |  |  |  |
| XM-188A |  |  |  |  |  |  |  |
| XM-191 |  |  |  |  |  |  |  |
| 1N HCl |  |  |  |  |  |  |  |
| 20% CH |  |  |  |  |  |  |  |

TABLE 2

| Component | H | I | J | K | L | M | N |
|---|---|---|---|---|---|---|---|
| HEP | 30 |  |  |  |  |  |  |
| 25% TMAH | 1 | 10 | 8.8 | 4 |  | 3 | 4.9 |
| ACA |  |  |  |  |  |  |  |
| CyDTA |  | 0.92 |  |  | 0.35 |  | 0.24 |
| TEOS |  |  |  |  |  |  |  |
| DMPD |  |  |  |  |  |  |  |
| SFL |  | 120 |  |  | 50 | 30 | 37 |
| EG |  |  |  |  | 10 |  |  |
| CAT |  |  |  |  |  |  |  |
| 60% EHDP |  |  |  |  |  | 0.24 | 0.29 |
| EDTMP |  |  |  |  |  |  |  |
| TMAF |  |  |  |  |  |  |  |
| 10% TMAS | 1 |  |  |  |  |  |  |
| 29% $NH_4OH$ |  |  |  |  |  |  |  |
| 30% $H_2O_2$ | 2 | 10 | 8.8 | 2.5 | 4.2 | 2.5 | 4 |
| Water | 15 | 60 |  |  |  |  | 9 |
| XM-188 |  |  | 40 | 40 |  |  |  |
| XM-188A |  |  |  |  |  |  |  |
| XM-191 |  |  |  |  |  |  |  |
| 1N HCl |  |  |  |  |  |  |  |
| 20% CH |  |  |  |  |  |  |  |

TABLE 3

| Component | O | P | Q | R | S | T | U |
|---|---|---|---|---|---|---|---|
| HEP |  |  |  |  |  |  |  |
| 25% TMAH | 5 | 20 | 4.4 |  | 7.8 |  |  |
| ACA |  |  |  |  |  |  |  |
| CyDTA |  |  |  |  |  |  |  |
| TEOS |  |  |  |  |  |  |  |
| DMPD |  |  |  |  |  |  |  |
| SFL |  | 200 | 37.5 |  | 42.5 |  |  |
| EG |  |  |  |  |  | 10.3 | 15 |
| CAT |  |  |  |  |  |  |  |
| 60% EHDP | 1.5 | 2.6 |  |  |  |  |  |
| EDTMP |  |  | 0.68 |  |  |  |  |
| TMAF |  |  |  |  |  |  | 2 |
| 10% TMAS |  |  |  |  |  |  |  |
| 29% $NH_4OH$ |  |  |  |  |  |  |  |
| 30% $H_2O_2$ | 19.2 | 18.7 | 4.8 | 5 | 4.3 |  | 5 |
| Water | 20 | 70 | 22.5 |  | 10.6 | 3.5 |  |

TABLE 3-continued

| Component | O | P | Q | R | S | T | U |
|---|---|---|---|---|---|---|---|
| XM-188 | 200 | | | | | 40 | |
| XM-188A | | | | 57.4 | | | 40 |
| XM-191 | | | | | | | |
| 1N HCl | | | | | | | |
| 20% CH | | | | | | | |

TABLE 4

| Component | V | W | X | Y | Z | AA | BB |
|---|---|---|---|---|---|---|---|
| HEP | | | | | | | |
| 25% TMAH | | | | | | | |
| ACA | | | | | | | |
| CyDTA | 0.39 | | | | 0.39 | | |
| TEOS | | | | | | | |
| DMPD | | | | | | | |
| SFL | 50 | | | 50 | 50 | 50 | 40 |
| EG | | 15 | 15 | | | | |
| CAT | | 3 | | | 3.5 | 3.5 | 1.5 |
| 60% EHDP | | | | | | | |
| EDTMP | | | 0.6 | | 0.6 | 0.6 | |
| TMAF | | | | | | | |
| 10% TMAS | | | | | | | |
| 29% NH$_4$OH | 1.4 | | | 1.9 | 1.4 | 1.9 | 2 |
| 30% H$_2$O$_2$ | 6.4 | 5.8 | 5.5 | 7.2 | 6.7 | 6.7 | 7.6 |
| Water | 12.5 | | | 20 | 12.5 | 20 | 30 |
| XM-188 | | 40 | 40 | | | | |
| XM-188A | | | | | | | |
| XM-191 | | | | | | | |
| 1N HCl | | | | | | | |
| 20% CH | | | | | | | |

TABLE 5

| Component | CC | DD | EE | FF | GG | HH | II |
|---|---|---|---|---|---|---|---|
| HEP | | | | | | | |
| 25% TMAH | | | 2 | | | | |
| ACA | | | | | | | |
| CyDTA | 0.39 | | | | | | |
| TEOS | | | | | | | |
| DMPD | | | | | | | |
| SFL | 50 | 50 | | 60 | | 60 | |
| EG | | | | 50 | | | |
| CAT | | | | | | | |
| 60% EHDP | | | | | | | |
| EDTMP | | 0.6 | | | | | |
| TMAF | | | | | | | |
| 10% TMAS | | | | | | | |
| 29% NH$_4$OH | 1.7 | 2.2 | | | | | |
| 30% H$_2$O$_2$ | 7 | 7.3 | 5 | 5 | 5 | 6.2 | 2.5 |
| Water | 12.5 | 20 | | | | | |
| XM-188 | | | | | | 40 | |
| XM-188A | | | 57 | | | | |
| XM-191 | | | | | | | |
| 1N HCl | | | | | 1 | | |
| 20% CH | | | | | | | |

TABLE 6

| Component | JJ | KK | LL | MM | NN | OO |
|---|---|---|---|---|---|---|
| HEP | | | | | | |
| 25% TMAH | 5 | 5 | 6 | | 5 | 6 |
| ACA | | | | | | |
| CyDTA | | | | | | |
| TEOS | | | | | | |
| DMPD | | | | | | |
| SFL | | | | | | |
| EG | | | | | | |
| CAT | | | | | | |
| 60% EHDP | | | | | | |
| EDTMP | | | | | | |
| TMAF | | | | | | |
| 10% TMAS | | | | | | |
| 29% NH$_4$OH | | | | | | |
| 30% H$_2$O$_2$ | 7 | 7.5 | 6 | 2.5 | 7 | 6 |
| Water | | 5 | | | | |
| XM-188 | | | 80 | 40 | | 80 |
| XM-188A | | | | | | |
| XM-191 | 62.5 | 64.5 | | | 62.5 | |
| 1N HCl | | | | | | 1 |
| 20% CH | | | | | | |

TABLE 7

| Component | PP | QQ | RR | SS | TT | UU | VV |
|---|---|---|---|---|---|---|---|
| HEP | | | | | | | |
| 25% TMAH | 25 | 25 | 20 | 25 | 17.5 | 17.5 | 2.5 |
| ACA | | | | | | | |
| CyDTA | 3 | 3 | 2.5 | 1.5 | | | 0.23 |
| TEOS | | | | | | | |
| DMPD | | | | | | | |
| SFL | 300 | 300 | 300 | 300 | 150 | 150 | 30 |
| EG | 5 | | | | 40 | 20 | 15 |
| CAT | | | | | | | 3 |
| 60% EHDP | | | | | | | |
| EDTMP | | | | | 1.8 | 1.8 | |
| TMAF | | | | | | | |
| 10% TMAS | | | | | | | |
| 29% NH$_4$OH | | | | | | | |
| 30% H$_2$O$_2$ | 36.8 | 37.3 | 36.7 | 37.2 | 26 | 24 | 5.8 |
| Water | 35 | 45 | 45 | 45 | 50 | 50 | 7.5 |
| XM-188 | | | | | | | |
| XM-188A | | | | | | | |
| XM-191 | | | | | | | |
| 1N HCl | | | | | | | |
| 20% CH | | | | | | | |

TABLE 8

| Component | WW | XX | YY | ZZ | AAA | BBB | CCC |
|---|---|---|---|---|---|---|---|
| HEP | | | | | | | |
| 25% TMAH | | | | | | 3.1 | 7.5 |
| ACA | | | | | | | |
| CyDTA | 0.39 | | 0.39 | | 0.28 | 1.2 | 0.8 |
| TEOS | | | | | | | |
| DMPD | | | | | | 7.5 | |
| SFL | 50 | 50 | 50 | 50 | 74 | | 75 |
| EG | | | | | | | |
| CAT | 3.5 | 3.5 | | | | | |
| 60% EHDP | | | | | | | |
| EDTMP | | | 0.6 | | 0.6 | | |
| TMAF | | | | | | | |
| 10% TMAS | | | | | | | |
| 29% NH$_4$OH | 1.4 | 1.9 | 1.4 | 1.9 | | | |

TABLE 8-continued

| | Formulations | | | | | | |
|---|---|---|---|---|---|---|---|
| Component | WW | XX | YY | ZZ | AAA | BBB | CCC |
| 30% $H_2O_2$ | 6.8 | 7.6 | 6.4 | 7.25 | 14.7 | 13.6 | 14 |
| Water | 12.5 | 20 | 12.5 | 20 | 40 | 25 | 25 |
| XM-188 | | | | | | | |
| XM-188A | | | | | | | |
| XM-191 | | | | | | | |
| 1N HCl | | | | | | | |
| 20% CH | | | | | | | 12 |

TABLE 9

| | Formulations | |
|---|---|---|
| Component | DDD | EEE |
| HEP | | 75 |
| 25% TMAH | 6.25 | 7.5 |
| ACA | | |
| CyDTA | 0.6 | 1.2 |
| TEOS | | |
| DMPD | | |
| SFL | | |
| EG | 75 | |
| CAT | | |
| 60% EHDP | | |
| EDTMP | | |
| TMAF | | |
| 10% TMAS | | |
| 29% $NH_4OH$ | | |
| 30% $H_2O_2$ | 13.4 | 13.6 |
| Water | 25 | 25 |
| XM-188 | | |
| XM-188A | | |
| XM-191 | | |
| 1N HCl | | |

In formulation b) of component (2) of the cleaning compositions of this invention, the polar organic solvent is a solvent with hydrogen bonding capability and which is minimally or non-reactive with the oxidizing agent. Such organic solvents include amides, sulfones, sulfolenes, selenones, and saturated alcohols. Among the preferred solvents there may be mentioned sulfolane (tetrahydrothiophene-1,1-dioxide), 3-methylsulfolane, n-propyl sulfone, n-butyl sulfone, sulfolene (2,5-dihydrothiopene-1,1-dioxide), 3-methylsulfolene, amides such as 1-(2-hydroxyethyl)-2-pyrrolidinone (HEP), dimethylpiperidone (DMPD), N-methylpyrrolidinone (NMP), and dimethylacetamide (DMAc), dimethylformamide (DMF), and saturated alcohols such as ethanol, propanol, butanol, hexanol, ethylene glycol, propylene glycol, glycerol, and hexafluoroisopropanol. The organic solvent component of formulation b) can include one or more of the solvents and is generally present in the formulation b) in an amount of from about 1 to about 99.9 wt %, preferably in an amount of from about 10 to about 90 wt %, and most preferably in an amount of from about 30 to 80 wt % of formulation b). These solvents are resistant to acidic and alkaline conditions and will not bind with oxidizing agents too tightly. Additionally, when the formulation of this invention are combined with an oxidizing agent they are capable of stabilizing the oxidizing agent, such as hydrogen peroxide, by forming stable complexes through interaction such as hydrogen bonding.

The alkaline base In formulation b) of component (2) of the cleaning compositions of this invention can be present in an amount of from about 0.1 to about 30 wt %, preferably in an amount of from about 0.1 to about 10 wt %, most preferably in an amount of from about 0.1 to about 5 wt % of formulation b). Any suitable alkaline base may be employed in formulation b) of component (2) of the cleaning compositions of this invention. The base is preferably ammonia hydroxide or an ammonia or non-ammonia derived base. When the cleaning composition of this invention is intended to be used to clean copper metallized structures the base is preferably a non-ammonia derived base and when the cleaning composition of this invention is intended to be used to clean aluminum containing structures the alkaline base is preferably ammonium hydroxide, a ammonia derived base, or a non-ammonia derived base in combination with a corrosion-inhibiting co-solvent and/or corrosion-inhibiting agent, as disclosed hereinafter. As examples of suitable non-ammonia derived bases there may be mentioned tetraalkylammonium hydroxides such as those of the formula $R_4N^+OH^-$ where each R is independently a substituted or unsubstituted alkyl groups, preferably of 1 to 22 carbon atoms and more preferably 1 to 4 carbon atoms. Among the non-ammonia derived alkaline bases useful in the compositions there may be mentioned, for example, tetramethylammonium hydroxide, tertrabutylammonium hydroxide, choline hydroxide, and the like. Inorganic bases such as for example potassium hydroxide, sodium hydroxide and the like may also be used as the alkaline base.

Water can be present in formulation b) of component (2) of the cleaning compositions of this invention and when present can be present in an amount of from about 0.1 to about 98 wt %, preferably in an amount of from about 10 to about 60 wt %, most preferably in an amount of from about 15 to about 50 wt % of formulation b). The water can be present as part of the aqueous portion of the other components and/or as additional added water.

The cleaning composition of this invention can also be employed under acid pH conditions and any suitable acid component can be employed in formulation b) of component (2) of the cleaning compositions of this invention in the necessary amount sufficient to provide the acidic pH to the composition, such as for example HCl or HF.

Formulation b) of component (2) of the cleaning compositions of this invention may also optionally include one or more corrosion-inhibiting co-solvents. Preferred corrosion-inhibiting co-solvents useful in the compositions of this invention are those of the general formula

where $R_1$ and $R_2$ are each independently selected from H, alkyl, preferably alkyl of from 1 to 6 carbon atoms, aryl, preferably aryl of from 3 to 14 carbon atoms, $OR_3$ and $SO_2R_4$; n is a numeral of from 2 to 6, preferably 2 or 3; W and Y are each independently selected from $OR_3$, and $SO_2R_4$: and $R_3$ and $R_4$, are each independently selected from H, alkyl, preferably alkyl of from 1 to 6 carbon atoms, and aryl, preferably aryl of from 3 to 14 carbon atoms. As examples of such corrosion-inhibiting co-solvents there may be mentioned, for example, ethylene glycol, propylene glycol and glycerol and the like. If the required polar organic solvent component of the formulation b) is not a saturated alcohol within the above-mentioned formula, a saturated alcohol may be present as a co-solvent. The co-solvents may be present in the composition in an amount of from 0 to about 80 wt %, preferably from about 1 to about 50 wt %, most preferably from about 1 to 30 wt % of formulation b).

Formulation b) of component (2) of the cleaning compositions of this invention may also contain other corrosion-inhibiting agents, preferably aryl compounds containing two or more OH, $OR_5$ and/or $SO_2R_6$ groups bonded directly to the aromatic ring, where $R_5$, and $R_6$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in formulation b) in an amount of from 0 to about 15 wt %, preferably from about 0.1 to about 10 wt %, most preferably from about 0.5 to about 5 wt % of formulation b)

Organic or inorganic chelating or metal complexing agents are not required, but offer substantial benefits, such as for example, improved product stability if present in formulation b) of component (2) of the cleaning compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e.g. ethylenediamine tetra(methylene phosphonic acid) (EDTMP), diethylenetriamine penta(methylene phosphonic acid), triethylenetetramine hexa(methylene phosphonic acid). The chelating agent will be present in formulation b) in an amount of from 0 to about 5 wt %, preferably from about 0.1 to about 2 wt % of formulation b). Metal chelating or complexing agents of various phosphonates, such as ethylenediamine tetra(methylene phosphonic acid) (EDTMP) offer much improved stabilization of the formulation b) when they are combined with oxidizing agents at acidic and alkaline conditions and thus are generally preferred.

Optionally other metal corrosion inhibitors, such as benzotriazole, may be employed in formulation b) of component (2) of the cleaning compositions of this invention an amount of from 0 to about 5 wt %, preferably from about 0.1 to 2 wt % of formulation b).

Formulation b) of component (2) of the cleaning compositions of this invention optionally may also contain surfactants, such as for example dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in formulation b) in an amount of from 0 to about 5 wt %, preferably 0.1 to about 3 wt % of formulation b).

Formulation b) of component (2) of the cleaning compositions of this invention may also optionally contain fluoride compounds in the formulation, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in formulation b) in an amount of from 0 to 10 wt %, preferably from about 0.1 to 5 wt % of formulation b).

Formulation b) of component (2) of the cleaning compositions of this invention can be employed in combination with oxidizing agents. Such formulations can contain any oxidizing agent suitable for use in nanoelectronic and microelectronic cleaning compositions. As examples of such oxidizing agents there may be mentioned, for example, peroxides, particularly hydrogen peroxide, molecular adducts of peroxyhydrates from hydrogen peroxides and oxyacids, zirconyl acetate and azo compounds, e.g., sodium percarbonate, sodium perborates, as well as periodates ($IO_4^-$), perborates, permanganates ($MnO_4^-$), hydrogen persulfates, persulfates and alkyloxyhalides, for example t-BuOCl. Other peroxy compounds from substitution reactions of $H_2O_2$ and organic molecules may be employed but are less preferred. Examples include alkylperoxides, peroxyacids, diacyl peroxides and ketone peroxides. Similar substitution products of $H_2O_2$ with inorganic molecules, such as peroxysulfuric acid, may also be employed. When the formulations b) of this invention are combined with an oxidizing agent the oxidizing agent is employed in the resulting cleaning compositions in an amount of from about 0.1 to about 30 wt %, preferably from about 0.1 to about 5 wt %, and most preferably in an amount of from about 0.5 to about 5 wt % of formulation b). The preferred oxidizing agent is hydrogen peroxide ($H_2O_2$), preferably employed as a 3 to 30% aqueous solution.

Examples of formulations b) of component (2) of the cleaning composition of this invention are set forth in the following Tables 10 to 13, in which the amount of the components are indicated in parts by weight of the formulation.

In the following Tables the abbreviations employed are as follows.

TMAH=25% Tetramethylammonium hydroxide
HEP=1-(2hydroxyethyl)-2-pyrrolidinone,
CyDTA=trans-1,2-cyclohexanediamine tetraacetic acid
DMPD=dimethylpiperidone
SFL=sulfolane
EG=ethylene glycol
CAT=catechol
EDTMP=ethylenediamine tetra(methylene phosphonic acid)
$NH_4OH$=ammonium hydroxide
CH=choline hydroxide
Water=additional water over water from aqueous solution of components.

TABLE 10

| | Formulations | | | | | |
|---|---|---|---|---|---|---|
| Component | A | B | C | D | E | F |
| 25% TMAH | 25 | 17.5 | 10 | 2.5 | 2 | 9 |
| HEP | | | | | | |
| SFL | 300 | 150 | | 30 | 50 | |
| CyDTA | 2.3 | | 0.9 | 0.23 | 0.19 | 1.15 |
| EDTMP | | 1.8 | | | | |
| DMPD | | | 120 | | | |
| EG | | 30 | | 15 | | 200 |
| CAT | | | | 3 | | |
| 29% $NH_4OH$ | | | | | | |
| 20% CH | | | | | | |
| $H_2O$ | 75 | 60 | 60 | 7.5 | 12.5 | |

TABLE 11

| | Formulations | | | | | |
|---|---|---|---|---|---|---|
| Component | G | H | I | J | K | L |
| 25% TMAH | 25 | 25 | 20 | 25 | 17.5 | 17.5 |
| HEP | | | | | | |
| SFL | 300 | 300 | 300 | 300 | 150 | 150 |
| CyDTA | 3 | 3 | 2.5 | 1.5 | | |
| EDTMP | | | | | 1.8 | 1.8 |
| DMPD | | | | | | |
| EG | 5 | 30 | | | 40 | 20 |
| CAT | | | | | | |
| 29% $NH_4OH$ | | | | | | |
| 20% CH | | | | | | |
| $H_2O$ | 35 | 45 | 45 | 45 | 50 | 50 |

TABLE 12

| Component | \multicolumn{6}{c}{Formulations} | | | | | |
|---|---|---|---|---|---|---|
| | M | N | O | P | Q | R |
| 25% TMAH | 2.5 | | | | | 3.1 |
| HEP | | | | | | |
| SFL | 30 | 50 | 50 | 50 | 50 | 74 |
| CyDTA | 0.23 | 0.39 | | 0.39 | | 0.28 |
| EDTMP | | | 0.6 | | 0.6 | |
| DMPD | | | | | | |
| EG | 15 | | | | | |
| CAT | 3 | 3.5 | 3.5 | | | |
| 29% NH$_4$OH | | 1.4 | 1.9 | 1.4 | 1.9 | |
| 20% CH | | | | | | |
| H$_2$O | 7.5 | 12.5 | 20 | 12.5 | 20 | 40 |

TABLE 13

| Component | \multicolumn{4}{c}{Formulations} | | | |
|---|---|---|---|---|
| | S | T | U | V |
| 25% TMAH | 7.5 | 17.5 | 6.25 | 7.5 |
| HEP | | | | 75 |
| SFL | | 75 | | |
| CyDTA | 1.2 | 0.8 | 0.6 | 1.2 |
| EDTMP | | | | |
| DMPD | 75 | | | |
| EG | | | | |
| CAT | | | | |
| 29% NH$_4$OH | | | | |
| 20% CH | | | 12 | |
| H$_2$O | 25 | 25 | 25 | 25 |

Formulation c) of component (2) of the cleaning compositions of this invention will comprise one or more of any suitable non-ammonium producing strong base containing non-nucleophilic, positively charged counter ions and one or more of any suitable solvent stable under strong alkaline conditions and having a metal-corrosion inhibiting arm in the solvent compound. Among the suitable non-ammonia producing strong bases containing non-nucleophilic, positively charged counter ions suitable for use in the cleaning compositions of this invention there may be mentioned tetraalkylammonium hydroxides or salts of the formula [(R)$_4$N$^+$]$_p$[X$^{-q}$], where each R is independently a substituted or unsubstituted alkyl, preferably alkyl of from 1 to 22, and more preferably 1 to 6, carbon atoms (R≠H); and X=OH or a suitable salt anion, such as carbonate and the like; p and q are equal and are integer of from 1 to 3. Suitable strong bases also include KOH and NaOH. Cleaning compositions of this invention containing a formulation c) as component (2) and containing the non-ammonium producing strong bases containing non-nucleophilic, positively charged counter ions show much improved compatibility with porous and low-κ dielectrics and copper metallization. Ammonia-free tetraalkylammonium hydroxides (TAAH) are very strong bases, yet they have been discovered to provide surprisingly improved compatibility with porous and low-κ dielectrics compared to cleaning compositions with ammonium hydroxide. Especially preferred are tetramethylammonium hydroxide, tetrabutylammonium hydroxide and choline hydroxide.

Formulation c) of component (2) of the cleaning compositions of this invention contain one or more "corrosion inhibiting solvent", i.e., a solvent compound that has at least two sites capable of complexing with metal is employed. Preferred as such corrosion inhibiting solvents are compounds having two or more sites capable of complexing with a metal and having one of the two following general formulae:

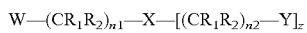

or

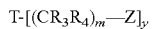

where W and Y are each independently selected from =O, —OR, —O—C(O)—R, —C(O)—, —C(O)—R, —S, —S(O)—R, —SR, —S—C(O)—R, —S(O)$_2$—R, —S(O)$_2$, —N, —NH—R, —NR$_1$R$_2$, —N—C(O)—R, —NR$_1$—C(O)—R$_2$, —P(O), —P(O)—OR and —P(O)—(OR)$_2$; X is alkylene, cycloalkylene or cycloalkylene containing one or more hetero atoms selected from O, S, N and P atoms, and arylene or arylene containing one or more hetero atoms selected from O, S, N and P atoms; each R, R$_1$ and R$_2$ are each independently selected from hydrogen, alkyl, cycloalkyl or cycloalkyl containing one or more hetero atoms selected from O, S, N and P atoms, and aryl or aryl containing one or more hetero atoms selected from O, S, N and P atoms; each of n1 and n2 is independently an integer of from 0 to 6; and z is an integer of from 1 to 6 when X is alkylene, cycloalkylene or arylene; and z is an integer of from 0 to 5 when X is cycloalkylene containing one or more hetero atoms selected from O, S, N and P atoms or arylene containing one or more hetero atoms selected from O, S, N and P atoms; T is selected from —O, —S, —N and —P; Z is selected from hydrogen, —OR$_5$, —N(R$_5$)$_2$, and —SR$_5$; each of R$_3$, R$_4$ and R$_5$ are each independently selected from hydrogen, alkyl, cycloalkyl or cycloalkyl containing one or more hetero atoms selected from O, S, N and P atoms, and aryl or aryl containing one or more hetero atoms selected from O, S, N and P atoms; m is an integer of from 0 to 6 and y is an integer of from 1 to 6. In the above definitions alkyl and alkylene are preferably of from 1 to 6 carbon atoms, more preferably of from 1 to 3 carbon atoms, cycloalkyl and cycloalkylene preferably contain from 3 to 6 carbon atoms, and aryl and arylene preferably contain from about 3 to 14 carbon atoms, more preferably from about 3 to 10 carbon atoms. Alkyl is preferably methyl, ethyl or propyl; alkylene is preferably methylene, ethylene or propylene; aryl is preferably phenyl; arylene is preferably phenylene; hetero-substituted cycloalkyl is preferably dioxyl, morpholinyl and pyrrolidinyl; and hetero-substituted aryl is preferably pyridinyl.

Some suitable examples are of such corrosion inhibiting solvents employed in formulation c) of component (2) of the cleaning compositions of this invention include, for example, but are not limited to ethylene glycol, diethylene glycol, glycerol, diethylene glycol dimethyl ether, monoethanolamine, diethanolamine, triethanolamine, N,N-dimethylethanolamine, 1-(2-hydroxyethyl)-2-pyrrolidinone, 4-(2-hydroxyethyl)morpholine, 2-(methylamino)ethanol, 2-amino-2-methyl-1-propanol, 1-amino-2-propanol, 2-(2-aminoethoxy)-ethanol, N-(2-hydroxyethyl) acetamide, N-(2-hydroxyethyl) succinimide and 3-(diethylamino)-1,2-propanediol.

Formulation c) of component (2) of the cleaning compositions of this invention containing the non-ammonium producing strong bases can be formulated into aqueous, semi-aqueous or organic solvent-based compositions. The non-ammonium producing, strong bases containing non-nucleophilic, positively charged counter ions can be used with corrosion inhibiting solvents alone or in combination with other stable solvents, preferably one or more polar organic solvents resistant to strong bases and that do not contain unhindered nucleophiles, such as dimethyl sulfoxide (DMSO), sulfolane (SFL), and dimethyl piperidone. The formulation c) of component (2) of the cleaning compositions of this invention may also optionally contain organic or inorganic acids, preferably weak organic or inorganic acids, hindered amines, hindered alkanolamines, and hindered hydroxylamines. Formulation c) of component (2) of the cleaning compositions of this invention can also contain other metal corrosion inhibitors, such as benzotriazole, and aryl compounds containing 2 or more OH or OR groups, where R is alkyl or aryl, such as for example, catechol, pyrogallol, resorcinol and the like. The formulation c) of component (2) of the cleaning compositions of this invention may also contain any suitable surfactants, such as for example dimethyl hexynol (Surfynol-61), ethoxylated tetramethyl decynediol (Surfynol-465), polytetrafluoroethylene cetoxypropylbetaine (Zonyl FSK), (Zonyl FSH) and the like.

Any suitable metal ion-free silicate may be used in the formulation c) of component (2) of the cleaning compositions of this invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits. The silicates may be present in the formulation c) of component (2) of the cleaning compositions of this invention in an amount of from about 0 to 10 wt. %, preferably in an amount of from about 0.1 to about 5 wt. % of the formulation c).

The formulation c) of component (2) of the cleaning compositions of this invention may also be formulated with suitable metal chelating agents to increase the capacity of the formulation to retain metals in solution and to enhance the dissolution of metallic residues on the wafer substrate. The chelating agent will generally be present in the formulation c) of component (2) of the cleaning compositions of this invention in an amount of from about 0 to 5 wt. %, preferably from an amount of from about 0.1 to 2 wt. % of the formulation c). Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

The formulation c) of component (2) of the cleaning compositions of this invention may also optionally contain fluoride compounds in the formulation, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in the formulation c) of component (2) of the cleaning compositions of this invention an amount of from 0 to 10 wt. %, preferably from about 0.1 to 5 wt. % of formulation c).

In the following Tables the following abbreviations are employed to designate the indicated components.

HEP=1-(2-hydroxyethyl)-2-pyrrolidinone
TMAH=25% tetramethylammonium hydroxide
BT=benzotriazole
DMSO=dimethyl sulfoxide
TEA=triethanolamine
CyDTA=trans-1,2-cyclohexanediamine tetraacetic acid
SFL=sulfolane
EG=ethylene glycol
CAT=catchol
EDTMP=ethylenediamine tetra(methylene phosphonic acid)
DMPD=dimethylpiperidone
TMAF=25% tetramethylammonium fluoride
BSA=benzenesulfonic acid
TMAS=10% tetramethylammonium silicate Examples of the types of formulation c) of component (2) of the cleaning compositions of this invention are set forth in the following Tables 14, 15, and 16 in which the amounts of the components are indicated in parts by weight.

TABLE 14

| Component | A | B | C | D | E | F | G | H |
|---|---|---|---|---|---|---|---|---|
| HEP | 90 | | | | | | | 90 |
| H₂O | | 7 | 8 | 32 | 16 | 12 | | 8 |
| TMAH | 10.8 | 15 | 16 | 16 | 16 | 24 | 10 | 2.7 |
| BT | 0.11 | | | | | | | 0.11 |
| DMSO | | 16 | | | | | | |
| TEA | | 16 | 16 | 16 | | 24 | 10 | |
| CyDTA | | | 0.2 | 0.2 | | 0.3 | | |
| SFL | | | 16 | 16 | 24 | 24 | 40 | |
| EG | | | | | | | | |
| CAT | | | | | | | | |
| EDTMP | | | | | | | | |
| DMPD | | | | | | | | |

TABLE 15

| | FORMULATIONS | | | |
|---|---|---|---|---|
| Component | I | J | K | L |
| HEP | | | | |
| H₂O | 54 | 54 | 32 | 32 |
| TMAH | 45 | 36 | 4 | 16 |
| BT | | | | |
| DMSO | | 16 | | |
| TEA | 36 | 36 | 16 | 16 |
| CyDTA | | | 0.4 | |
| SFL | | | 16 | 16 |
| EG | 54 | 54 | 48 | |
| CAT | | | 6 | |
| EDTMP | 0.36 | 0.36 | | 0.4 |
| DMPD | | | | 16 |

In Table 16 there are described variations of Compositions D and F of Table 13 with additional added optional components.

TABLE 16

| | FORMULATIONS | | | | | | |
|---|---|---|---|---|---|---|---|
| Component | M | N | O | P | Q | R | S |
| Composition D | 100 | 100 | 100 | | | | 100 |
| Composition F | | | | 100 | 100 | 100 | |
| TMAF | 2.5 | | | 2.5 | | | |
| TMAH | | 2 | | | 2 | | 2 |
| H$_2$O | | | | 10 | 10 | 10 | |
| BSA | | | | 2 | | | 2 |
| H$_2$SO$_4$ | | 0.5 | | | 0.5 | | 0.5 |
| TMAS | | | | | | | 1 |

The formulation d) of component (2) of the cleaning compositions of this invention will comprise one or more of any suitable non-ammonium producing, non-HF producing fluoride salt (non-ammonium, quaternary ammonium fluoride salt) in a suitable solvent. Among the suitable non-ammonia producing, non-HF producing fluoride salts there may be mentioned tetraalkylammonium fluorides of the formula (R)$_4$N$^+$F$^-$, where each R is independently a substituted or unsubstituted alkyl, preferably alkyl of from 1 to 22, and more preferably 1 to 6, carbon atoms (R≠H), such as tetramethylammonium fluoride and tetrabutylammonium fluoride salts; as well as fluoroborates, tetrabutylammonium fluoroborates, aluminum hexafluorides, antimony fluoride and the like.

The non-ammonium producing, non-HF producing fluoride salts show significantly improved compatibility with low-κ dielectrics and copper metallization. Tetraalkylammonium salts, such as tetramethylammonium fluoride (TMAF) can be blended and dissolved in water, certain anhydrous organic solvents, or water and one or more polar, water miscible organic solvents. Selection of a copper/low-κ compatible "friendly" solvent is also advantageous. Any suitable solvent free of strong nucleophiles, such as unhindered primary or secondary amines, is preferably employed. Preferred solvents do not include unhindered nucleophiles, and include for example, such as dimethyl sulfoxide (DMSO), sulfolane (SFL), dimethyl piperidone, 1-(2-hydroxyethyl)-2-pyrrolidinone (HEP), 1-methyl-2-pyrrolidinone and dimethylacetamide and the like. Polar nitrile-containing solvents, such as acetonitrile, isobutylnitrile and the like, can be especially advantageous.

Moreover, whereas anhydrous ammonium fluoride is practically insoluble in most organic solvents, in contradistinction, tetraalkylammonium fluoride salts, such as for example tetramethylammonium fluoride (TMAF), can be blended and completely dissolved in organic solvents, such as for example 1-(2-hydroxyethyl)-2-pyrrolidinone (HEP). Thus, a very simple, completely anhydrous, and effective formulation d) of component (2) of the cleaning compositions of this invention for cleaning photoresist and ash residues from substrates having a low-κ dielectric and copper metallization can be readily prepared. An example of such completely anhydrous formulation d) of component (2) of the cleaning compositions of this invention is 50 parts by weight HEP and 0.8 parts by weight TMAF.

Additionally, while not required by the fluoride salt-containing formulation d) of component (2) of the cleaning compositions of this invention, it may in some instances be desirable to optionally include in the formulation d) one or more "corrosion inhibiting solvent", i.e., a solvent compound that has at least two sites capable of complexing with metal is employed. Preferred as such corrosion inhibiting solvents are compounds having two or more sites capable of complexing with a metal and having one of the two following general formulae:

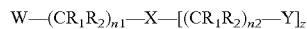

or

where W and Y are each independently selected from =O, —OR, —O—C(O)—R, —C(O)—, —C(O)—R, —S, —S(O)—R, —SR, —S—C(O)—R, —S(O)$_2$—R, —S(O)$_2$, —N, —NH—R, —NR$_1$R$_2$, —N—C(O)—R, —NR$_1$—C(O)—R$_2$, —P(O), —P(O)—OR and —P(O)—(OR)$_2$; X is alkylene, cycloalkylene or cycloalkylene containing one or more hetero atoms selected from O, S, N and P atoms, and arylene or arylene containing one or more hetero atoms selected from O, S, N and P atoms; each R, R$_1$ and R$_2$ are each independently selected from hydrogen, alkyl, cycloalkyl or cycloalkyl containing one or more hetero atoms selected from O, S, N and P atoms, and aryl or aryl containing one or more hetero atoms selected from O, S, N and P atoms; each of n1 and n2 is independently an integer of from 0 to 6; and z is an integer of from 1 to 6 when X is alkylene, cycloalkylene or arylene; and z is an integer of from 0 to 5 when X is cycloalkylene containing one or more hetero atoms selected from O, S, N and P atoms or arylene containing one or more hetero atoms selected from O, S, N and P atoms; T is selected from —O—S, —N and —P; Z is selected from hydrogen, —OR$_5$, —N(R$_5$)$_2$, and —SR$_5$; each of R$_3$, R$_4$ and R$_5$ are each independently selected from hydrogen, alkyl, cycloalkyl or cycloalkyl containing one or more hetero atoms selected from O, S, N and P atoms, and aryl or aryl containing one or more hetero atoms selected from O, S, N and P atoms; m is an integer of from 0 to 6 and y is an integer of from 1 to 6. Such corrosion inhibiting solvents may optionally be present in the formulation d) of component (2) of the cleaning compositions of this invention in an amount of from about 0 to about 80, preferably from about 0 to about 50, and most preferably from about 5 to about 40%, by weight of the formulation d).

In the above definitions alkyl and alkylene are preferably of from 1 to 6 carbon atoms, more preferably of from 1 to 3 carbon atoms, cycloalkyl and cycloalkylene preferably contain from 3 to 6 carbon atoms, and aryl and arylene preferably contain from about 3 to 14 carbon atoms, more preferably from about 3 to 10 carbon atoms. Alkyl is preferably methyl, ethyl or propyl; alkylene is preferably methylene, ethylene or propylene; aryl is preferably phenyl; arylene is preferably phenylene; hetero-substituted cycloalkyl is preferably dioxyl, morpholinyl and pyrrolidinyl; and hetero-substituted aryl is preferably pyridinyl.

Some suitable examples are of such corrosion inhibiting solvents include, for example, but are not limited to ethylene glycol, diethylene glycol, glycerol, diethylene glycol dimethyl ether, monoethanolamine, diethanolamine, triethanolamine, N,N-dimethylethanolamine, 1-(2-hydroxyethyl)-2-pyrrolidinone, 4-(2-hydroxyethyl)morpholine, 2-(methylamino)ethanol, 2-amino-2-methyl-1-propanol, 1-amino-2-propanol, 2-(2-aminoethoxy)-ethanol, N-(2-hydroxyethyl) acetamide, N-(2-hydroxyethyl) succinimide and 3-(diethylamino)-1,2-propanediol.

While previous attempts to control or inhibit metal corrosion have involved careful controlling of pH and/or using other corrosion inhibiting compounds, such as benzotriazole (BT), at relatively low concentrations of <2% by weight, it has been discovered that unexpected, significant improvement in controlling copper metal corrosion can be provided by the formulation d) of component (2) of the cleaning compositions of this invention without the need for such corrosion inhibiting compounds. However, if desired such corrosion inhibiting compounds may optionally be present in the formulation d) of component (2) of the cleaning compositions of this invention. Examples of such other corrosion inhibiting compounds include for example benzotriazole, and aryl compounds containing 2 or more OH or OR groups, where R is alkyl or aryl, such as for example, catechol, pyrogallol, resorcinol and the like. Such other metal corrosion inhibiting compounds may optionally be present in formulation d) of component (2) of the cleaning compositions of this invention an amount of from about 0 to about 40% by weight of formulation d).

The formulation d) of component (2) of the cleaning compositions of this invention may also contain surfactants, such as for example dimethyl hexynol (Surfynol-61), ethoxylated tetramethyl decynediol (Surfynol-465), polytetrafluoroethylene cetoxypropylbetaine (Zonyl FSK), (Zonyl FSH) and the like.

Any suitable metal ion-free silicate may be used in the formulation d) of component (2) of the cleaning compositions of this invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits. The silicates may be present in the formulation d) of component (2) of the cleaning compositions of this invention in an amount of from about 0 to 10 wt. %, preferably in an amount of from about 0.1 to about 5 wt. % of formulation d).

The formulation d) of component (2) of the cleaning compositions of this invention may also be formulated with suitable metal chelating agents to increase the capacity of the formulation to retain metals in solution and to enhance the dissolution of metallic residues on the wafer substrate. The chelating agent will generally be present in the formulation d) of component (2) of the cleaning compositions of this invention in an amount of from about 0 to 5 wt. %, preferably from an amount of from about 0.1 to 2 wt. % of formulation d). Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and aminophosphonic acids such as EDTMP.

The formulation d) of component (2) of the cleaning compositions of this invention containing the non-ammonium producing, non-HF producing salts can be formulated into aqueous, semi-aqueous or organic solvent-based compositions. The non-ammonium producing, non-HF producing salts can be used with any suitable stable solvents, preferably one or more polar organic solvents resistant to strong bases and that do not contain unhindered nucleophiles, such as dimethyl sulfoxide (DMSO), sulfolane (SFL), dimethyl piperidone, HEP, 1-methyl-2-pyrrolidinone and dimethylacetamide and the like. Polar nitrile-containing solvents, such as acetonitrile, isobutylnitrile and the like, can be especially advantageous. The formulation d) of component (2) of the cleaning compositions of this invention may also optionally contain organic or inorganic acids, preferably weak organic or inorganic acids, hindered amines, hindered alkanolamines, and hindered hydroxylamines, such as triisopropylamine, and other corrosion inhibitors.

In the following Table 17 the abbreviations employed to designate the indicated components are as follows.
HEP=1-(2-hydroxyethyl)-2-pyrrolidinone
TMAF=20% tetramethylammonium fluoride
BT=benzotriazole
DMSO=dimethyl sulfoxide
TEA=triethanolamine
TBAF=75% tetrabutylammonium fluoride Examples of compositions of this invention are set forth in the following Table 17, in which the amount of the components are indicated in parts by weight of the formulation.

TABLE 17

| COMPONENT | FORMULATIONS | | |
|---|---|---|---|
| | A | B | C |
| HEP | 90 | 45 | 54 |
| H$_2$O | 16 | 15 | |
| TBAF | 5.75 | | |
| TMAF | | 15 | |
| ANHYDROUS TMAF | | | 0.8 |
| BT | 0.11 | 0.4 | |
| DMSO | | 15 | |
| TEA | | 15 | |

The formulation e) of component (2) of the cleaning compositions of this invention will comprise one or more of any suitable non-ammonium producing strong base containing non-nucleophilic, positively charged counter ions and one or more of any suitable steric hindered amide solvent stable under strong alkaline conditions. Among the suitable non-ammonia producing strong bases containing non-nucleophilic, positively charged counter ions suitable for use in the formulation e) of component (2) of the cleaning compositions of this invention there may be mentioned tetraalkylammonium hydroxides of the formula:

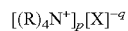

where each R is independently a substituted or unsubstituted alkyl, preferably alkyl or hydroxy alkyl of from 1 to 22, and more preferably 1 to 6, carbon atoms (R≠H); and X=OH or a suitable salt anion, such as carbonate and the like; and p and q are equal and are integers of 1 to 3. Suitable strong bases also include KOH and NaOH. Formulation e) of component (2) of the cleaning compositions of this invention containing the non-ammonium producing strong bases containing non-nucleophilic, positively charged counter ions show much improved compatibility with low-κ dielectrics and copper metallization. Ammonia-free tetraalkylammonium hydroxides (TAAH) are very strong bases, yet they have been discovered to provide surprisingly improved low-κ compatibility compared to cleaning compositions with ammonium hydroxide. Especially preferred are tetramethylammonium hydroxide, tetrabutylammonium hydroxide, choline hydroxide and tetramethyl ammonium carbonate.

While previous attempts to control or inhibit metal corrosion have involved careful controlling of pH and/or using corrosion inhibiting compounds, such as benzotriazole (BT), at relatively low concentrations of <2% by weight, it has been discovered that unexpected, significant improvement in controlling copper metal corrosion can be provided to the formulation e) of component (2) of the cleaning compositions of this invention when one or more steric hindered amide solvent is employed in formulation e). Any suitable steric hindered amide solvent may be employed in the cleaning compositions of this invention. Preferred as such steric hindered amide solvents are hindered acyclic and hindered cyclic amides of the formulae

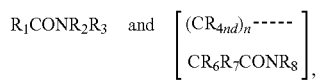

where n is a numeral of from 1 to 22, preferably 1 to 6; and $R_1$, $R_2$, $R_3$, $R_4$, $R_5$, $R_6$, $R_7$ and $R_8$ are each independently selected from H, alkyl (substituted or unsubstituted), preferably alkyl of from 1 to 6 carbon atoms, and aryl (substituted or unsubstituted), preferably aryl of from 3 to 14 carbon atoms, with the proviso the at least one of $R_1$, $R_2$, and $R_3$ and at least one of $R_4$, $R_5$, $R_6$, $R_7$ and $R_8$ is not hydrogen.

Some suitable examples of such steric hindered amide acyclic solvents include, for example, acetamide, dimethyl formamide (DMF), N,N'-dimethyl acetamide (DMAc), benzamide and the like. Some suitable examples of steric hindered cyclic amides include, for example, N-methyl-2-pyrrolidinone (NMP), 1,5-dimethyl-2-pyrrolidinone, 1,3-dimethyl-2-piperidone, 1-(2-hydroxyethyl)-2-pyrrolidinone, 1,5-dimethyl 2-piperidone and the like.

The formulation e) of component (2) of the cleaning compositions of this invention containing the non-ammonium producing strong bases can be formulated into aqueous, semi-aqueous or organic solvent-based compositions. The non-ammonium producing, strong bases containing non-nucleophilic, positively charged counter ions can be used with steric hindered amide solvents alone or in combination with other stable solvents, preferably one or more polar organic solvents resistant to strong bases and that do not contain unhindered nucleophiles, such as dimethyl sulfoxide (DMSO), sulfolane (SFL), dimethyl piperidone, diethanolamine, triethanolamine, 2-(methylamino)ethanol, 3-(dimethylamino)-1,2-propanediol and the like. The formulation e) of component (2) of the cleaning compositions of this invention may also optionally contain organic or inorganic acids, preferably weak organic or inorganic acids, hindered amines, hindered alkanolamines, and hindered hydroxylamines and other corrosion inhibitors, such as benzotriazole, catechol, glycerol, ethylene glycol and the like. The formulation e) of component (2) of the cleaning compositions of this invention may also contain any suitable surfactants, such as for example dimethyl hexynol (Surfynol-61), ethoxylated tetramethyl decynediol (Surfynol-465), polytetrafluoroethylene cetoxypropylbetaine (Zonyl FSK), (Zonyl FSH) and the like.

Any suitable metal ion-free silicate may be used in the formulation e) of component (2) of the cleaning compositions of this invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica. Metal silicates such as sodium metasilicate may be used but are not recommended due to the detrimental effects of metallic contamination on integrated circuits. The silicates may be present in the formulation e) of component (2) of the cleaning compositions of this invention in an amount of from about 0 to 10 wt. %, preferably in an amount of from about 0.1 to about 5 wt. % of formulation e).

The formulation e) of component (2) of the cleaning compositions of this invention may also be formulated with suitable metal chelating agents to increase the capacity of the formulation to retain metals in solution and to enhance the dissolution of metallic residues on the wafer substrate. The chelating agent will generally be present in the formulation e) of component (2) of the cleaning compositions of this invention in an amount of from about 0 to 5 wt. %, preferably from an amount of from about 0.1 to 2 wt. % of formulation e). Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, gallic acid, propyl gallate, pyrogallol, 8-hydroxyquinoline, and cysteine. Preferred chelating agents are aminocarboxylic acids such as EDTA, CyDTA and EDTMP.

The formulation e) of component (2) of the cleaning compositions of this invention may also optionally contain fluoride compounds in formulation, such as for example, tetramethylammonium fluoride, tetrabutylammonium fluoride, and ammonium fluoride. Other suitable fluorides include, for example fluoroborates, tetrabutylammonium fluoroborates, aluminum hexafluorides, antimony fluoride and the like. The fluoride components will be present in formulation e) of component (2) of the cleaning compositions of this invention an amount of from 0 to 10 wt. %, preferably from about 0.1 to 5 wt. % of formulation e).

Examples of these types of formulations e) of component (2) of the cleaning compositions of this invention are set forth in the following Table 18, in which the amount of the components are indicated in parts by weight of the formulation. In Table 18 the following abbreviations are used to indicate the various components.

DMPD=dimethyl piperidone
TMAH=25% tetramethylammonium hydroxide
TEA=triethanolamine
CyDTA=trans-1,2-cyclohexanediamine tetraacetic acid
SFL=sulfolane
HEP=1-(2-hydroxyethyl)-2-pyrrolidinone
NMP=N-methylpyrrolidinone
EDTMP=ethylenediamine tetra(methylene phosphonic acid)

TABLE 18

| COMPONENT | FORMULATIONS | | | | | | | |
|---|---|---|---|---|---|---|---|---|
| | A | B | C | D | E | F | G | H |
| DMPD | 32 | 26 | 26 | | 20 | | 50 | 16 |
| $H_2O$ | 32 | 32 | 32 | | | | | 32 |
| TMAH | 16 | 16 | 16 | 10 | 10 | 10 | 10 | 16 |
| TEA | | 16 | | | | | | 15 |
| CyDTA | | 0.2 | | | | | | |
| SFL | | | 16 | | 30 | | | |
| HEP | | | | 50 | | | | |
| NMP | | | | | | | 50 | |
| EDTMP | | | | | | | | 0.4 |

The aforementioned types of formulations a) through e) employed as component (2) of the nanaoelectronic and microelectronic cleaning compositions of this invention can be successfully used as supercritical fluid modifiers/additives for the main supercritical fluid component (1) of such compositions and provide many benefits, such as:

A) the ability to form reasonably stable, homogeneous supercritical fluid together with the main supercritical fluid component (1);
B) good stability (or "minimally reactive") under supercritical pressures and temperatures;
C) good compatibilities with supercritical construction materials (e.g. stainless steel;
D) improved cleaning performance and good substrate compatibilities;
E) superior solvating strength, mass-transfer, with little or no surface tension, and diffusivity over the traditional "non-supercritical" technologies, and are particularly useful for cleaning structures with high aspect ratios or porous materials,
F) enables lower consumption of main supercritical fluid component (1); and
G) elimination or minimization of required drying steps.

The cleaning capabilities of the compositions used in supercritical fluid technologies described above is further illustrated by, but not limited to, the following cleaning examples employing nanoelectronic and microelectronic cleaning compositions of this invention wherein there is cleaned an etched via sample with photoresist/carbon doped oxide (PR/CDO) structure. The results of the cleaning of said structure with the cleaning compositions of this invention are set forth in Table 20. The cleaning process was conducted in a 75-mL cleaning vessel filled with glass beads to fill most voids (space). The cleaning of the etched via sample with photoresist/carbon doped oxide (PR/CDO) structure in the vessel was accomplished by introducing into the vessel separately, but simultaneously, by separate lines, a flow of the component (1) main supercritical fluid ($CO_2$) and a flow of the component (2) formulation modifier/additive at the flow rates, temperatures, and pressures indicated in the process conditions column of Table 20 and wherein:

Formulation #1=17:26:1.5:0.5 SFL-$H_2O$-25% TMAH-CyDTA
Formulation #2=150:60:17.5:1.8:30 SFL-$H_2O$-25% TMAH-EDTMP-EG; and
Formulation #3=300:35:5:25:3 SFL-$H_2O$-EG-25% TMAH-CyDTA;

where CyDTA=trans-1,2-cyclohexanediamine tetraacetic acid; EDTMP=ethylenediamine tetra (methylene phosphonic acid; SFL=sulfolane; EG=ethylene glycol; TMAH=tetramethylammonium hydroxide and $H_2O_2$ is hydrogen peroxide.

TABLE 20

| Compositions and Process Conditions | Cleaning Performance | Substrate Compatibility |
|---|---|---|
| Master (Main) solvent: $CO_2$ at 12 g/min flow rate; Modifier formulation: [8:1 Formulation #1:30% $H_2O_2$], at 1.8 g/min flow rate; Pressure: 150 bars; Temperature: 100° C.; Run time: 60 minutes. | Remove all PR (bulk PR and tough "skin") and stubborn via residues (100%) | No CDO etch |
| Master (Main) solvent: $CO_2$ at 15 g/min flow rate; Modifier: [8:1 Formulation #2:30% $H_2O_2$], at 2.25 g/min flow rate; Pressure: 188 bars; Temperature: 100° C.; Run time: 60 minutes | Remove all PR (bulk PR and tough "skin") and stubborn via residues (100%) | No CDO etch |
| Master (Main) solvent: $CO_2$ at 15 g/min flow rate; Modifier: [8:1 Formulation #3:30% $H_2O_2$], at 2.25 g/min flow rate; Pressure: 200 bars; Temperature: 100° C.; Run time: 60 minutes | Remove all PR (bulk PR and tough "skin") and stubborn via residues (100%) | No CDO etch |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A cleaning composition suitable for cleaning nanoelectronic and microelectronic substrates under supercritical fluid conditions, said composition comprising (1) a supercritical main fluid reaching a supercritical fluid state at a temperature of 250° C. or less and a pressure of 600 bars or less (592.2 atm, 8702.3 psi), and (2) as a secondary fluid, a modifier formulation selected from the group consisting of following formulations:
  a) a formulation comprising:
    an oxidizing agent;
    a polar organic solvent selected from the group consisting of sulfones, sulfolenes, and selenones;
    an alkaline base of the formula $R_4N^+OH^-$ wherein each R is independently a substituted or unsubstituted alkyl group of 1 to 22 carbon atoms:
    water; and
    q chelating or metal complexing agent selected from the group consisting of trans-1,2-cyclohexanediamine tetraacetic acid (CyDTA), ethylenediamine tetraacetic acid (EDTA), stannates, pyrophosphates, ethane-1-hydroxy-1,1-diphosphonate, ethylenediamine tetra (methylene phosphonic acid) (EDTMP), diethylenetriamine penta(methylene phosphonic acid), and triethylenetetramine hexa(methylene phosphonic acid);
    and optionally one or more of the following components:
    an acid;
    a corrosion-inhibiting co-solvent;
    an oxidizer stabilizing agent;
    a corrosion-inhibiting agent;
    a metal corrosion inhibitor;
    a fluoride compound; and
    a surfactant;
  b) a silicate free formulation comprising:
    a polar organic solvent selected from the group consisting of sulfones, sulfolenes and selenones; and
    a strong alkaline base of the formula $R_4N^+OH^-$ wherein each R is independently a substituted or unsubstituted alkyl group of 1 to 22 carbon atoms;
    water; and
    q chelating or metal complexinq agent selected from the group consisting of trans-1,2-cyclohexanediamine tetraacetic acid (CyDTA), ethylenediamine tetraacetic acid (EDTA), stannates, pyrophosphates, ethane-1-hydroxy-1,1-diphosphonate, ethylenediamine tetra (methylene phosphonic acid) (EDTMP), diethylenetriamine penta(methylene phosphonic acid), and triethylenetetramine hexa(methylene phosphonic acid);
    and optionally one or more of the following components:
    an acid;
    a corrosion-inhibiting co-solvent;
    an oxidizer stabilizing agent;
    a corrosion-inhibiting agent;
    a metal corrosion inhibitor;
    a fluoride compound; and
  a surfactant;
    c) a formulation comprising:
    one or more non-ammonium producing strong base of the formula $[(R)_4N^+]_p[X^-_g]$, where each R is independently a substituted or unsubstituted alkyl of from 1 to 22 carbon atoms; and X=OH or a suitable salt anion, and p and q are equal and are integer of from 1 to 3;
    one or more corrosion inhibiting solvent compounds, said corrosion inhibiting solvent compound having at least two sites capable of complexing with metals and selected from the group consisting of ethylene glycol, diethylene glycol, glycerol, diethylene glycol dimethyl ether, monoethanolamine, diethanolamine, triethanolamine, N, N-dimethylethanolamine, 1-(2-hydroxyethyl)-2-pyrrolidinone, 4-(2-hydroxyethyl) morpholine, 2-(methylamino)ethanol, 2-amino-2-methyl-1-propanol, 1-amino-2-propanol, 2-(2-aminoethoxy)-ethanol, N-(2-hydroxyethyl) acetamide, N-(2-hydroxyethyl) succinimide and 3-(diethylamino)-1,2-propanediol;
    and optionally one or more of the following components:
    water or other organic co-solvent;
    a steric hindered amine or alkanolamine;
    an organic or inorganic acid;
    an other metal corrosion inhibitor compounds;
    a surfactant;
    a metal ion free silicate compound;
    a metal chelating agent; and
    a fluoride compound;
  d) a formulation comprising:
    one or more non-ammonium producing, non-HF producing fluoride salt of the formula $(R)_4N^+F^{31}$, where each R is independently a substituted or unsubstituted alkyl of from 1 to 22 carbon atoms;
    sulfolane, dimethyl sulfoxide and 1-(2-hydroxyethyl)-2-pyrrolidinone as organic solvents;
    and optionally one or more of the following components:
    a metal corrosion inhibiting solvent;
    a steric hindered amine or alkanolamine;
    an organic or inorganic acid; from about 0 to 40% by weight of an other metal corrosion inhibitor compound;
    a surfactant;
    a metal ion free silicate compound; and from about 0 to 5% by weight of a metal chelating agent; and
  e) a formulation comprising:
    one or more non-ammonium producing strong base of the formula $[(R)_4N^+]_p[X^-_g]$, where each R is independently a substituted or unsubstituted alkyl of from 1 to 22; carbon atoms; and X=OH or a suitable salt anion, and p and g are equal and are integer of from 1 to 3;
    one or more steric hindered amide, solvents selected from the group consisting of acetamide, dimethyl formamide (DMF), N,N'-dimethyl acetamide (DMAc), benzamide, N-methyl-2-pyrrolidinone (NMP), 1,5-dimethyl-2-pyrrolidinone, 1,3-dimethyl-2-piperidone, 1-(2-hydroxyethyl)-2-pyrrolidinone, and 1,5-dimethyl 2-piperidone;
    one or more ther organic co-solvent selected from the group consisting of dimethyl sulfoxide (DMSO), sulfolane (SFL), and dimethyl piperidone;
    and optionally one or more of the following components:
    a steric hindered amine or alkanolamine;
    an organic or inorganic acid;
    of an other metal corrosion inhibitor compounds;
    a surfactant;
    a metal ion free silicate compound;
    a metal chelating agent; and
    a fluoride compound.

2. A cleaning composition of claim 1 wherein the composition comprise from about 5%, to about 20% by weight of the secondary fluid modifier formulation component (2) based on the weight of the supercritical main fluid component (1).

3. A cleaning composition according to claim 1 wherein the supercritical main fluid comprises carbon dioxide.

4. A cleaning composition according to claim 3 wherein the secondary fluid modifier formulation comprises a formulation of sulfolane, water, tetramethylammonium hydroxide, trans-1, 2-cyclohexanediamine tetraacetic acid, and hydrogen peroxide.

5. A cleaning composition according to claim 3 wherein the secondary fluid modifier formulation comprises a formulation of sulfolane, water, ethylene glycol, tetramethylammonium hydroxide, trans-1,2-cyclohexanediamine tetraacetic acid, and hydrogen peroxide.

6. A cleaning composition according to claim 3 wherein the secondary fluid modifier formulation comprises a formulation of sulfolane, water, tetramethylammonium hydroxide, ethylenediamine tetra (methylene phosphonic acid, ethylene glycol, and hydrogen peroxide.

7. A process for cleaning a nanoelectronic or microelectronic substrate of photoresist or residue, the process comprising contacting the substrate for a time and at supercritical fluid conditions with a cleaning composition sufficient to clean the substrate, wherein the cleaning composition comprises (1) a supercritical main fluid reaching a supercritical fluid state at a temperature of 250° C. or less and a pressure of 600 bars or less (592.2 atm, 8702.3 psi), and (2) as a secondary fluid, a modifier formulation wherein the second fluid modifier comprises a formulation selected from the group consisting of the following formulations:

a) a formulation comprising:
    an oxidizing agent;
    a polar organic solvent selected from the group consisting of sulfones, sulfolenes, and selenones;
    an alkaline base of the formula $R_4N^+OH^-$ wherein each R is independently a substituted or unsubstituted alkyl group of 1 to 22 carbon atoms:
    water; and
    q chelating or metal complexing agent selected from the group consisting of trans-1,2-cyclohexanediamine tetraacetic acid (CyDTA), ethylenediamine tetraacetic acid (EDTA), stannates, pyrophosphates, ethane-1-hydroxy-1,1-diphosphonate, ethylenediamine tetra (methylene phosphonic acid) (EDTMP), diethylenetriamine penta(methylene phosphonic acid), and triethylenetetramine hexa(methylene phosphonic acid).
    and optionally one or more of the following components:
    an acid;
    a corrosion-inhibiting co-solvent;
    an oxidizer stabilizing agent;
    a corrosion-inhibiting agent;
    a metal corrosion inhibitor;
    a fluoride compound; and
    a surfactant;

b) a silicate free formulation comprising:
    a polar organic solvent selected from the group consisting of sulfones, sulfolenes and selenones; and
    a strong alkaline base of the formula $R_4N^+OH^-$ wherein each R is independently a substituted or unsubstituted alkyl group of 1 to 22 carbon atoms;
    water; and
    q chelating or metal complexing agent selected from the group consisting of trans-1,2-cyclohexanediamine tetraacetic acid (CvDTA), ethylenediamine tetraacetic acid (EDTA), stannates, pyrophosphates, ethane-1-hydroxy-1,1-diphosphonate, ethylenediamine tetra (methylene phosphonic acid) (EDTMP), diethylenetriamine penta(methylene phosphonic acid), and triethylenetetramine hexa(methylene phosphonic acid);
    and optionally one or more of the following components:
    an acid;
    a corrosion-inhibiting co-solvent;
    an oxidizer stabilizing agent;
    a corrosion-inhibiting agent;
    a metal corrosion inhibitor;
    a fluoride compound; and
    a surfactant;

c) a formulation comprising:
    one or more non-ammonium producing strong base of the formula $[(R)_4N^+]_p[X^-_q]$, where each R is independently a substituted or unsubstituted alkyl of from 1 to 22 carbon atoms; and X=OH or a suitable salt anion, and p and q are equal and are integer of from 1 to 3;
    one or more corrosion inhibiting solvent compounds, said corrosion inhibiting solvent compound having at least two sites capable of complexing with metals and selected from the group consisting of ethylene glycol, diethylene qlycol, glycerol, diethylene glycol dimethyl ether, monoethanolamine, diethanolamine, triethanolamine, N,N -dimethylethanolamine, 1-(2-hydroxyethyl)-2-pyrrolidinone, 4-(2-hydroxyethyl) morpholine, 2-(methylamino)ethanol, 2-amino-2-methyl-1-propanol, 1-amino-2-propanol, 2-(2-aminoethoxy)-ethanol, N-(2-hydroxyethyl) acetamide, N-(2-hydroxyethyl) succinimide and 3-(diethylamino)-1,2-propanediol;
    and optionally one or more of the following components:
    water or other organic co-solvent;
    a steric hindered amine or alkanolamine;
    an organic or inorganic acid;
    an other metal corrosion inhibitor compounds;
    a surfactant;
    a metal ion free silicate compound;
    a metal chelating agent; and
    a fluoride compound;

d) a formulation comprising:
    one or more non-ammonium producing, non-HF producing fluoride salt of the formula $(R)_4N^+F^{31}$, where each R is independently a substituted or unsubstituted alkyl of from 1 to 22 carbon atoms;
    sulfolane, dimethyl sulfoxide and 1-(2-hydroxyethyl)-2- pyrrolidinone as organic solvents;
    and optionally one or more of the following components:
    a metal corrosion inhibiting solvent;
    a steric hindered amine or alkanolamine;
    an organic or inorganic acid;
    from about 0 to 40% by weight of an other metal corrosion inhibitor compound;
    a surfactant;
    a metal ion free silicate compound; and from about 0 to 5% by weight of a metal chelating agent; and e) a formulation comprising:
    one or more non-ammonium producing strong base of the formula $[(R)_4N^+]_p[X^-_q]$, where each R is independently a substituted or unsubstituted alkyl of from 1 to 22 carbon atoms; and X=OH or a suitable salt anion, and p and q are equal and are integer of from 1 to 3;
    one or more steric hindered amide solvents selected from the group consisting of acetamide, dimethyl formamide (DMF), N,N'-dimethyl acetamide (DMAc), benzamide, N-methyl-2-pyrrolidinone (NMP), 1,5- dimethyl-2-pyrrolidinone, 1,3-dimethyl-2-piperidone, 1-(2-hydroxyethyl)-2-pyrrolidinone, and 1,5-dimethyl 2-piperidone;
one or more other organic co-solvent selected from the group consisting of dimethyl sulfoxide (DMSO), sulfolane (SFL), and dimethyl piperidone;
and optionally one or more of the following components:
a steric hindered amine or alkanolamine;
an organic or inorganic acid;
of an other metal corrosion inhibitor compounds;
a surfactant.;
a metal ion free silicate compound;
a metal chelating agent; and
a fluoride compound.

8. A process for cleaning a nanoelectronic or microelectronic substrate of photoresist or residue according to claim 7, wherein the composition comprise from about 5%, to about 20% by weight of the secondary fluid modifier formulation component (2) based on the weight of the supercritical main fluid component (1).

9. A process for cleaning a nanoelectronic or microelectronic substrate of photoresist or residue according to claim 7, wherein the supercritical main fluid comprises carbon dioxide.

10. A process for cleaning a nanoelectronic or microelectronic substrate of photoresist or residue according to claim 9, wherein the secondary fluid modifier formulation comprises a formulation of sulfolane, water, tetramethylammonium hydroxide, trans-1,2-cyclohexanediamine tetraacetic acid, and hydrogen peroxide.

11. A process for cleaning a nanoelectronic or microelectronic substrate of photoresist or residue according to claim 9, wherein the secondary fluid modifier formulation comprises a formulation of sulfolane, water, ethylene glycol, tetramethylammonium hydroxide, trans-1,2-cyclohexanediamine tetraacetic acid, and hydrogen peroxide.

12. A process for cleaning a nanoelectronic or microelectronic substrate of photoresist or residue according to claim 9, wherein the secondary fluid modifier formulation comprises a formulation of sulfolane, water, tetramethylammonium hydroxide, ethylenediamine tetra (methylene phosphonic acid, ethylene glycol, and hydrogen peroxide.

13. A cleaning composition according to claim 3 comprising:
tetramethylammonium fluoride, sulfolane, dimethyl sulfoxide and 1-(2-hydroxyethyl)-2-pyrrolidinone.

14. A process for cleaning a nanoelectronic or microelectronic substrate of photoresist or residue according to claim 9, wherein the secondary fluid modifier formulation comprises a formulation of tetramethylammonium fluoride, sulfolane, dimethyl sulfoxide and 1-(2-hydroxyethyl)-2- pyrrolidinone.

* * * * *